(12) United States Patent
Sasaki (10) Patent No.: US 7,394,323 B2
(45) Date of Patent: Jul. 1, 2008

(54) PLL FREQUENCY SYNTHESIZER

(75) Inventor: Makoto Sasaki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 42 days.

(21) Appl. No.: 10/573,689

(22) PCT Filed: Sep. 17, 2004

(86) PCT No.: PCT/JP2004/013684

§ 371 (c)(1),
(2), (4) Date: Mar. 27, 2006

(87) PCT Pub. No.: WO2005/031978

PCT Pub. Date: Apr. 7, 2005

(65) Prior Publication Data

US 2007/0035347 A1 Feb. 15, 2007

(30) Foreign Application Priority Data

Sep. 29, 2003 (JP) ............................. 2003-336800

(51) Int. Cl.
*H03L 7/107* (2006.01)
(52) U.S. Cl. .................... 331/16; 331/25; 331/74; 331/17; 327/156
(58) Field of Classification Search ............... 331/16, 331/17, 18, 25, 1 A, 74, 75, 76, 175; 327/156, 327/157
See application file for complete search history.

(56) References Cited

U.S. PATENT DOCUMENTS

| | | | |
|---|---|---|---|
| 3,934,092 A * | 1/1976 | Csicsatka | ................... 381/6 |
| 4,516,083 A | 5/1985 | Turney | |
| 5,889,438 A | 3/1999 | Yamaguchi | |
| 6,175,281 B1 | 1/2001 | Mori | |
| 6,252,468 B1 * | 6/2001 | Ohira | ........................ 331/74 |
| 6,441,692 B1 * | 8/2002 | Nakatani et al. | ............... 331/42 |
| 6,538,499 B1 * | 3/2003 | Lu | ............................. 327/557 |
| 6,538,518 B1 * | 3/2003 | Chengson | ..................... 331/17 |
| 6,972,633 B2 * | 12/2005 | Vilhonen et al. | .............. 331/17 |
| 2003/0007586 A1 | 1/2003 | Ishii | |

FOREIGN PATENT DOCUMENTS

| | | |
|---|---|---|
| JP | 04249920 | 9/1992 |
| JP | 2001 292059 | 10/2001 |
| JP | 2002 050979 | 2/2002 |

OTHER PUBLICATIONS

PCT International Search Report dated Dec. 21, 2004.
Supplementary European Search Report dated Oct. 10, 2007.

* cited by examiner

*Primary Examiner*—Robert J. Pascal
*Assistant Examiner*—Ryan J Johnson
(74) *Attorney, Agent, or Firm*—Dickinson Wright, PLLC (57) ABSTRACT

A PLL frequency synthesizer improves near C/N, shortens lockup time, and reduces residual FM. In this apparatus, an input current signal is converted to a voltage signal by one of a plurality of loop filters with different cutoff frequencies and output to a voltage controlled oscillator. An oscillation signal generated by the voltage controlled oscillator is branched at a first junction point and output to a frequency divider and an output terminal. A variable capacitance capacitor is connected to a second junction point branched subsequent to the first junction point and its capacitance is controlled in accordance with loop filter switching control of a control circuit.

5 Claims, 7 Drawing Sheets

PLL FREQUENCY SYNTHESIZER

TECHNICAL FIELD

The present invention relates to a PLL frequency synthesizer that oscillates a signal synchronized with the phase of an input signal.

BACKGROUND ART

Figure 1:
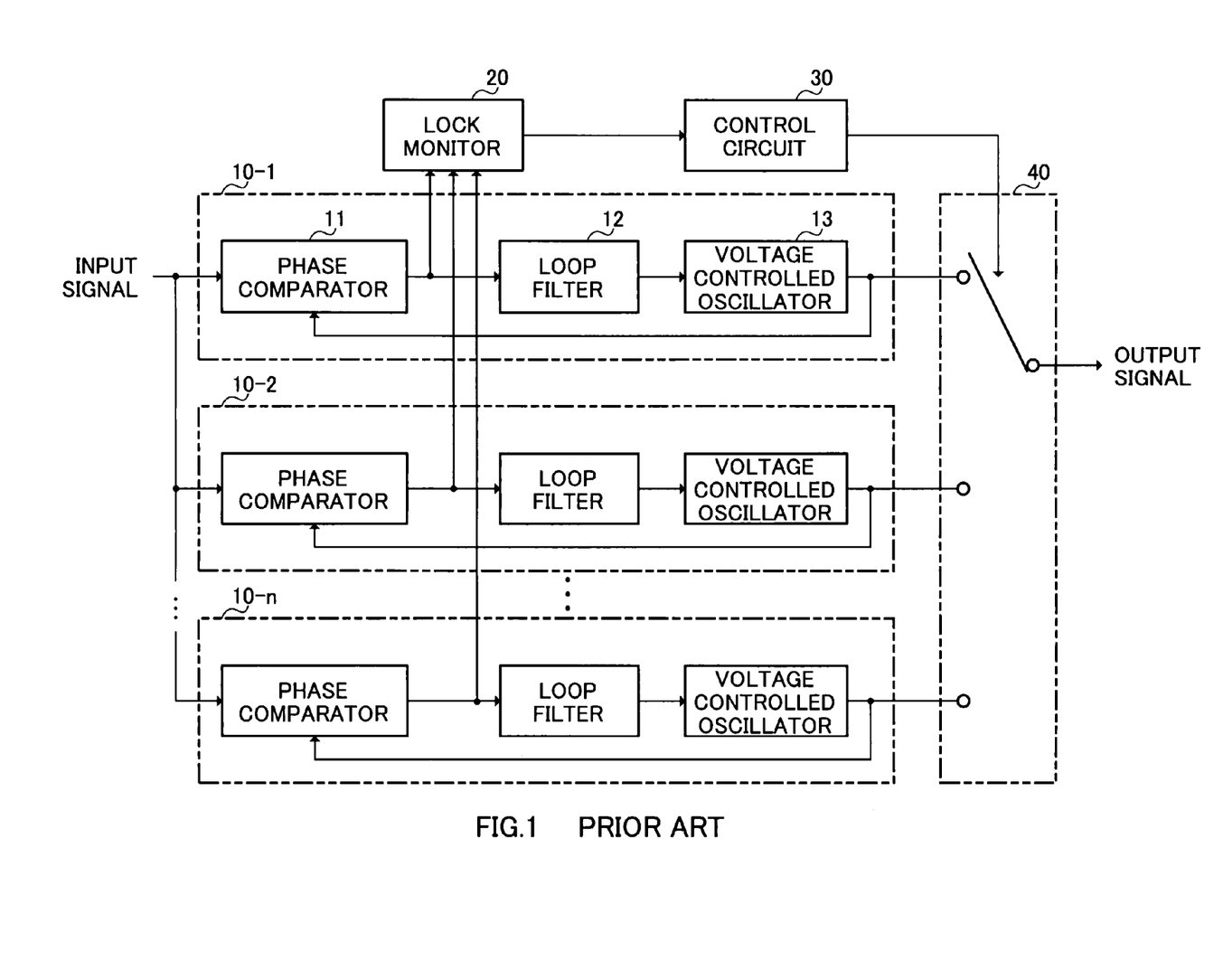
FIG. 1 is a block diagram showing the configuration of a conventional PLL frequency synthesizer.

Heretofore, the item described in Patent Document 1 has been known as a PLL frequency synthesizer. FIG. 1 is a block diagram showing the configuration of a conventional PLL frequency synthesizer. In this drawing, a plurality of PLL circuits 10-1 through 10-n having loop filters with different cutoff frequencies, provided in parallel with respect to an input signal, each output an oscillation signal phase-synchronized with the input signal. Specifically, to take the example of PLL circuit 10-1, the input signal is subjected to phase comparison by a phase comparator 11 with an oscillation signal output from a voltage controlled oscillator 13, and the comparison result is output to voltage controlled oscillator 13 via a loop filter 12, and is also output to a lock monitor 20.

Based on the comparison results output from the phase comparators of the PLL circuits, lock monitor 20 detects locked PLL circuits, and a control circuit 30 selects one PLL circuit from among the PLL circuits detected as locked based on a variable condition, and controls a switch 40, enabling the output signal (oscillation signal) of the selected PLL circuit to be obtained.

Here, conditions for PLL circuit selection by control circuit 30 include a case in which the PLL circuit having the loop filter with the highest cutoff frequency is selected, and a case in which the PLL circuit having the loop filter with the lowest cutoff frequency is selected. When the PLL circuit having the loop filter with the highest cutoff frequency is selected, the PLL frequency synthesizer can achieve improvement of near C/N and shortening of lockup time. On the other hand, when the PLL circuit having the loop filter with the lowest cutoff frequency is selected, the PLL frequency synthesizer can reduce residual FM, which is a frequency fluctuation component. Near C/N means C/N in the vicinity of the output spectrum of a voltage controlled oscillator. Residual FM represents the amount of frequency fluctuation of a voltage controlled oscillator within a short time, and can be measured with a modulation analyzer.

Thus, with a conventional PLL frequency synthesizer, a plurality of PLL circuits have loop filters with different cutoff frequencies, and an oscillation signal corresponding to the characteristics required by the system can be obtained by switching the loop filter.

Figure 2:
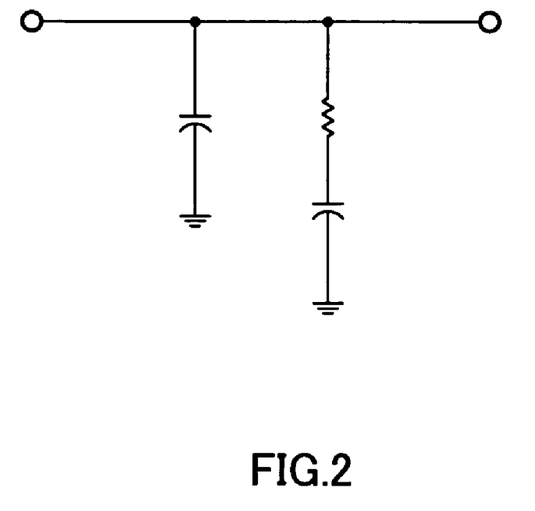
FIG. 2 is a drawing showing a sample configuration of a second-order loop filter.
Figure 3:
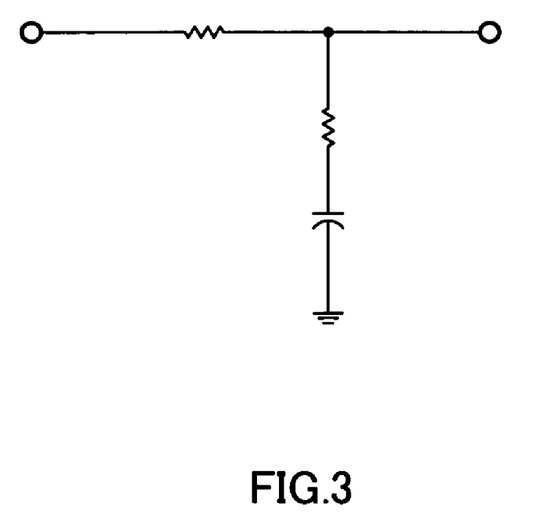
FIG. 3 is a drawing showing a sample configuration of a lag-lead filter.

Sample loop filter configurations are shown in FIG. 2 and FIG. 3. FIG. 2 shows a sample configuration of a second-order loop filter, and FIG. 3 shows a sample configuration of a lag-lead filter.

Patent Document 1: Unexamined Japanese Patent Publication No. 2001-292059

DISCLOSURE OF INVENTION

Problems to be Solved by the Invention

However, with the above-described conventional PLL frequency synthesizer, when the cutoff frequency is high, there is a problem in that, although improvement of near C/N and shortening of lockup time can be achieved, residual FM increases. Furthermore, when the cutoff frequency is low, there is a problem in that, although residual FM can be reduced, improvement of near C/N and shortening of lockup time cannot be achieved.

It is therefore an object of the present invention to provide a PLL frequency synthesizer that achieves improvement of near C/N, shortening of lockup time, and reduction of residual FM.

Means for Solving the Problems

A PLL frequency synthesizer of the present invention has a configuration comprising: a plurality of loop filters with different cutoff frequencies; an oscillation section that generates a frequency signal corresponding to a voltage output from the loop filters; a variable frequency fluctuation component elimination circuit that is provided between the oscillation section and an oscillation signal output terminal and that eliminates a frequency fluctuation component that varies for each of the plurality of loop filters; and a control section that performs control of the frequency fluctuation component elimination circuit in accordance with switching of the loop filters.

According to this configuration, by controlling a frequency fluctuation component elimination circuit in accordance with loop filter switching, when the loop filter is switched so as to give a cutoff frequency corresponding to the characteristics required by the system, if a loop filter with a high cutoff frequency is used, a frequency fluctuation component can be reduced without degrading near C/N and lockup time characteristics. Also, if a loop filter with a low cutoff frequency is used, a frequency fluctuation component can be further reduced, so that if the cutoff frequency is raised in proportion to this reduction, improvement of near C/N and shortening of lockup time can be achieved.

Advantageous Effect of the Invention

According to the present invention, a frequency fluctuation component elimination circuit that eliminates a frequency fluctuation component from an oscillation signal that includes a different frequency fluctuation component for each loop filter is provided between a voltage controlled oscillator and oscillation signal output terminal, and the frequency fluctuation component elimination circuit is controlled in accordance with loop filter switching, by which means when the cutoff frequency is high, residual FM can be reduced without degrading near C/N and lockup time characteristics, and when the cutoff frequency is low, residual FM can be further reduced, so that if the cutoff frequency is raised in proportion to this reduction, improvement of near C/N and shortening of lockup time can be achieved. By this means, improvement of near C/N, shortening of lockup time, and reduction of residual FM can be achieved.

BEST MODE FOR CARRYING OUT THE INVENTION

Embodiments of the present invention will be described below with reference to the accompanying drawings.

Embodiment 1

Figure 4:
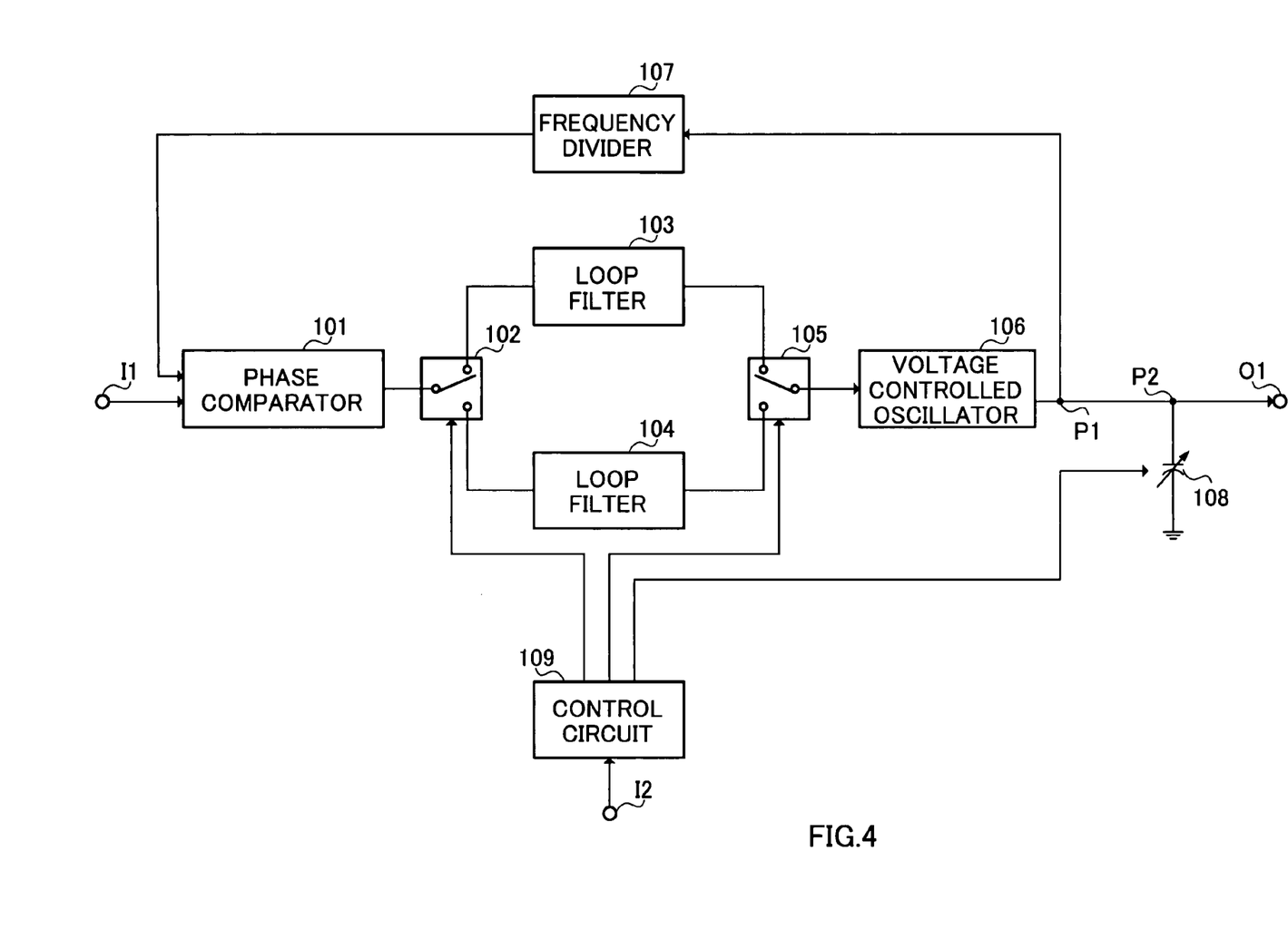
FIG. 4 is a block diagram showing the configuration of a PLL frequency synthesizer according to Embodiment 1 of the present invention.

FIG. 4 is a block diagram showing the configuration of a PLL frequency synthesizer according to Embodiment 1 of the present invention. In this diagram, a phase comparator 101 compares the phases of a signal input from an input terminal I1 and a signal output from a frequency divider 107, and a current signal corresponding to the phase difference is output to loop filter 103 or 104 via a switch circuit 102.

Loop filters 103 and 104 have different cutoff frequencies, and convert a current signal output from phase comparator 101 to a voltage signal, and output the voltage signal to a voltage controlled oscillator 106 via a switch circuit 105. Here, the cutoff frequency of loop filter 103 is assumed to be lower than the cutoff frequency of loop filter 104.

From voltage controlled oscillator 106, an oscillation signal of a frequency corresponding to the voltage output from loop filter 103 or 104 is branched at junction point P1, and is output to frequency divider 107 and an output terminal O1. Frequency divider 107 divides the frequency of the oscillation signal output from voltage controlled oscillator 106, and outputs the signal after the division to phase comparator 101.

A variable capacitance capacitor 108 provided as a frequency fluctuation component elimination circuit has one end connected to the output line of voltage controlled oscillator 106 (at a junction point designated P2), and its other end grounded. The capacitance of this capacitor is variable, and is changed in accordance with control from a control circuit 109.

Based on a signal input from an input terminal I2, control circuit 109 controls switch circuits 102 and 105 and variable capacitance capacitor 108, and selects use of either loop filter 103 or 104. The signal input from input terminal I2 reports either high near C/N mode and high-speed lockup mode or low residual FM mode to control circuit 109. Here, "mode" means a state in which the frequency synthesizer operates so that the characteristics required by the system are achieved.

Next, the operation of a PLL frequency synthesizer with the above-described configuration will be explained. When a signal input from input terminal I2 reports to control circuit 109 high near C/N mode and high-speed lockup mode, control circuit 109 controls switch circuits 102 and 105, and each switch circuit is connected to loop filter 104.

In phase comparator 101, the phases of the signal input from input terminal I1 and the phase of the signal output from frequency divider 107 are compared, a current signal corresponding to the phase difference is converted to a voltage signal by loop filter 104, and this voltage signal is output to voltage controlled oscillator 106.

An oscillation signal of a frequency corresponding to the voltage signal output from loop filter 104 is output by voltage controlled oscillator 106 to frequency divider 107 and output terminal O1, and the frequency of the oscillation signal output from voltage controlled oscillator 106 is divided by frequency divider 107. The oscillation signal output to output terminal O1 becomes shorted through self-resonance due to frequency fluctuation of the oscillation signal since variable capacitance capacitor 108 is grounded, and absorbs this frequency fluctuation, enabling residual FM constituting a frequency fluctuation component to be reduced. By this means, if a loop filter with a high cutoff frequency is used, residual FM can be reduced, so that if the cutoff frequency is raised in proportion to this reduction, near C/N can be further improved. However, as there is a trade-off relationship between residual FM and near C/N, residual FM cannot be reduced when near C/N is improved.

When a signal input from input terminal I2 reports to control circuit 109 low residual FM mode, control circuit 109 controls switch circuits 102 and 105, and each switch circuit is connected to loop filter 103.

In phase comparator 101, the phases of the signal input from input terminal I1 and the phase of the signal output from frequency divider 107 are compared, a current signal corresponding to the phase difference is converted to a voltage signal by loop filter 103, and this voltage signal is output to voltage controlled oscillator 106.

An oscillation signal of a frequency corresponding to the voltage signal output from loop filter 103 is output by voltage controlled oscillator 106 to frequency divider 107 and output terminal O1, and the frequency of the oscillation signal output from voltage controlled oscillator 106 is divided by frequency divider 107. In the oscillation signal output to output terminal O1, residual FM can be reduced by means of variable capacitance capacitor 108. By this means, if a loop filter with a low cutoff frequency is used, residual FM can be further reduced compared with the prior art. Also, if residual FM characteristics required by the system of the same level as in the prior art are acceptable, raising the cutoff frequency in proportion to the amount by which residual FM can be reduced enables near C/N to be improved.

Here, for the capacitance of variable capacitance capacitor 108, a value at which self-resonance occurs through residual FM in the case of high near C/N and high-speed lockup mode and in the case of low residual FM mode respectively is set beforehand. As variable capacitance capacitor 108 is not included in a PLL circuit loop circuit, degradation of near C/N characteristics and lockup time characteristics can be prevented.

Thus, according to this embodiment, by connecting a variable capacitance capacitor to a signal line that further branches after a junction point for feedback of voltage controlled oscillator output, and changing the capacitance of the variable capacitance capacitor in accordance with loop filter switching, when the cutoff frequency is high residual FM can be reduced without degrading near C/N and lockup time characteristics, and when the cutoff frequency is low residual FM can be further reduced, so that if the cutoff frequency is raised in proportion to this reduction, improvement of near C/N and shortening of lockup time can be achieved. By this means, improvement of near C/N, shortening of lockup time, and reduction of residual FM can be achieved.

Embodiment 2

Figure 5:
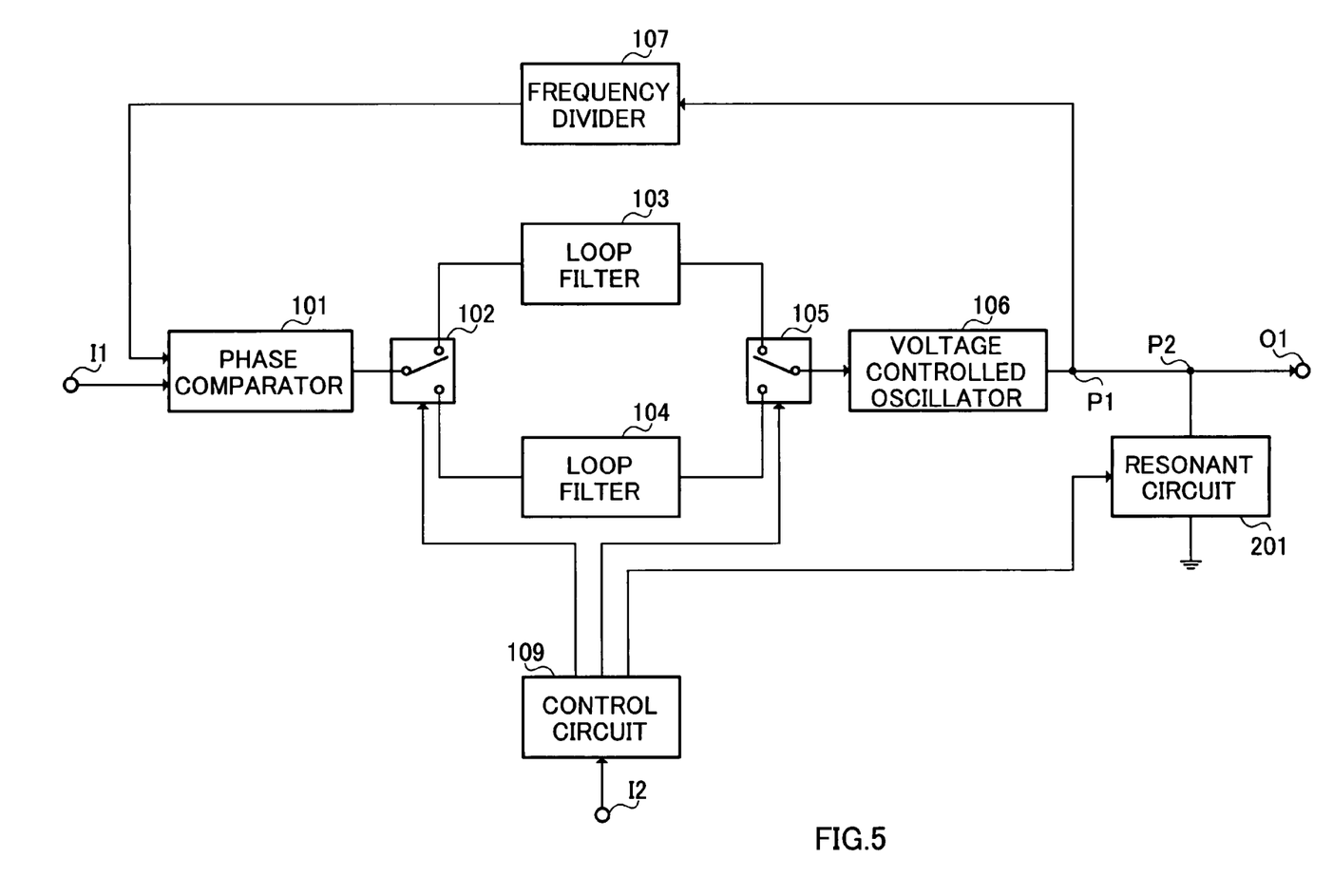
FIG. 5 is a block diagram showing the configuration of a PLL frequency synthesizer according to Embodiment 2 of the present invention.

FIG. 5 is a block diagram showing the configuration of a PLL frequency synthesizer according to Embodiment 2 of the present invention. Parts in FIG. 5 common to FIG. 4 are assigned the same codes as in FIG. 4, and detailed descriptions thereof are omitted. FIG. 5 differs from FIG. 4 in that variable capacitance capacitor 108 has been replaced by a resonance circuit 201.

Resonance circuit 201 provided as a frequency fluctuation component elimination circuit is set so that the residual FM component in high near C/N and high-speed lockup mode and the residual FM component in low residual FM mode are resonance frequencies, and a shorted state is established at the time of resonance. By this means, residual FM can be reduced.

Here, the residual FM component in each mode is found beforehand, and resonance circuit 201 can be made to resonate in each mode by having control circuit 109 control resonance circuit 201.

Thus, according to this embodiment, by connecting a resonance circuit to a signal line that further branches after a junction point for feedback of voltage controlled oscillator output, and changing the resonance frequency of the resonance circuit in accordance with loop filter switching, when the cutoff frequency is high residual FM can be reduced without degrading near C/N and lockup time characteristics, and when the cutoff frequency is low residual FM can be further reduced, so that if the cutoff frequency is raised in proportion to this reduction, improvement of near C/N and shortening of lockup time can be achieved. By this means, improvement of near C/N, shortening of lockup time, and reduction of residual FM can be achieved.

Embodiment 3

Figure 6:
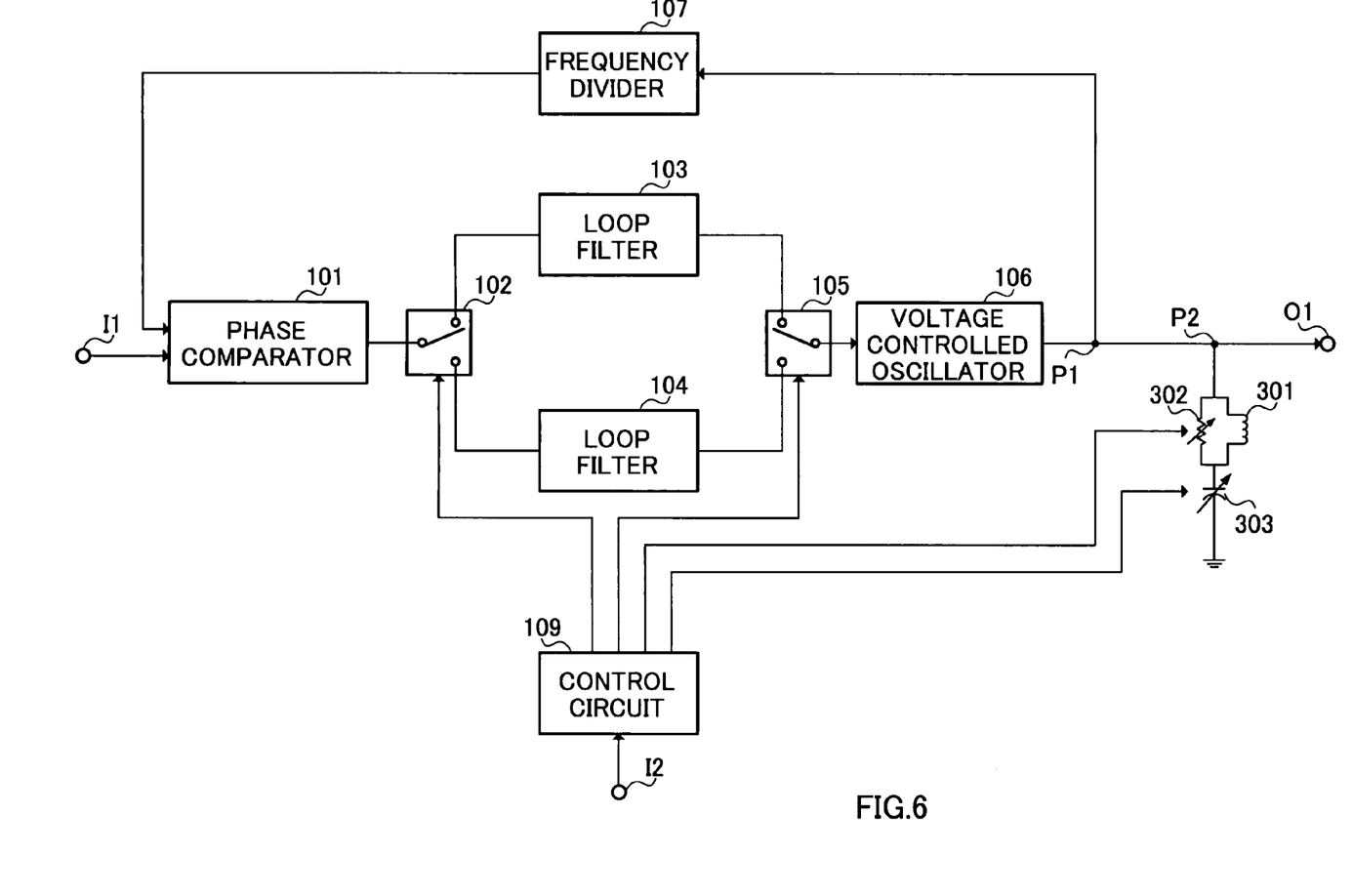
FIG. 6 is a block diagram showing the configuration of a PLL frequency synthesizer according to Embodiment 3 of the present invention.

FIG. 6 is a block diagram showing the configuration of a PLL frequency synthesizer according to Embodiment 3 of the present invention. Parts in FIG. 6 common to FIG. 4 are assigned the same codes as in FIG. 4, and detailed descriptions thereof are omitted. FIG. 6 differs from FIG. 4 in that an inductor 301 and variable resistor 302 have been added, and variable capacitance capacitor 108 has been replaced by a variable capacitance capacitor 303.

Inductor 301 and variable resistor 302 are connected in parallel. One end of inductor 301 and one end of variable resistor 302 are connected to junction point P2, and the other ends of inductor 301 and variable capacitance capacitor 303 are grounded via variable capacitance capacitor 303. The resistance value of variable resistor 302 can be changed under the control of control circuit 109.

Inductor 301 and variable capacitance capacitor 303 are such that the residual FM component in high near C/N and high-speed lockup mode and the residual FM component in low residual FM mode are resonance frequencies, and a shorted state is established at the time of series resonance. By this means, the residual FM component can be reduced. That is to say, inductor 301, variable resistor 302, and variable capacitance capacitor 303 function as a frequency fluctuation component elimination circuit.

Here, the residual FM component in each mode is found beforehand, and variable capacitance capacitor 303 and inductor 301 can be made to resonate in each mode by having control circuit 109 control variable capacitance capacitor 303 and variable resistor 302.

Thus, according to this embodiment, by connecting a parallel-connected inductor and variable resistor in series with a variable capacitance capacitor, and changing the capacitance of the variable capacitance capacitor and the resistance value of the variable resistor in accordance with loop filter switching, when the cutoff frequency is high, residual FM can be reduced without degrading near C/N and lockup time characteristics, and when the cutoff frequency is low, residual FM can be further reduced, so that if the cutoff frequency is raised in proportion to this reduction, improvement of near C/N and shortening of lockup time can be achieved. By this means, improvement of near C/N, shortening of lockup time, and reduction of residual FM can be achieved.

Embodiment 4

Figure 7:
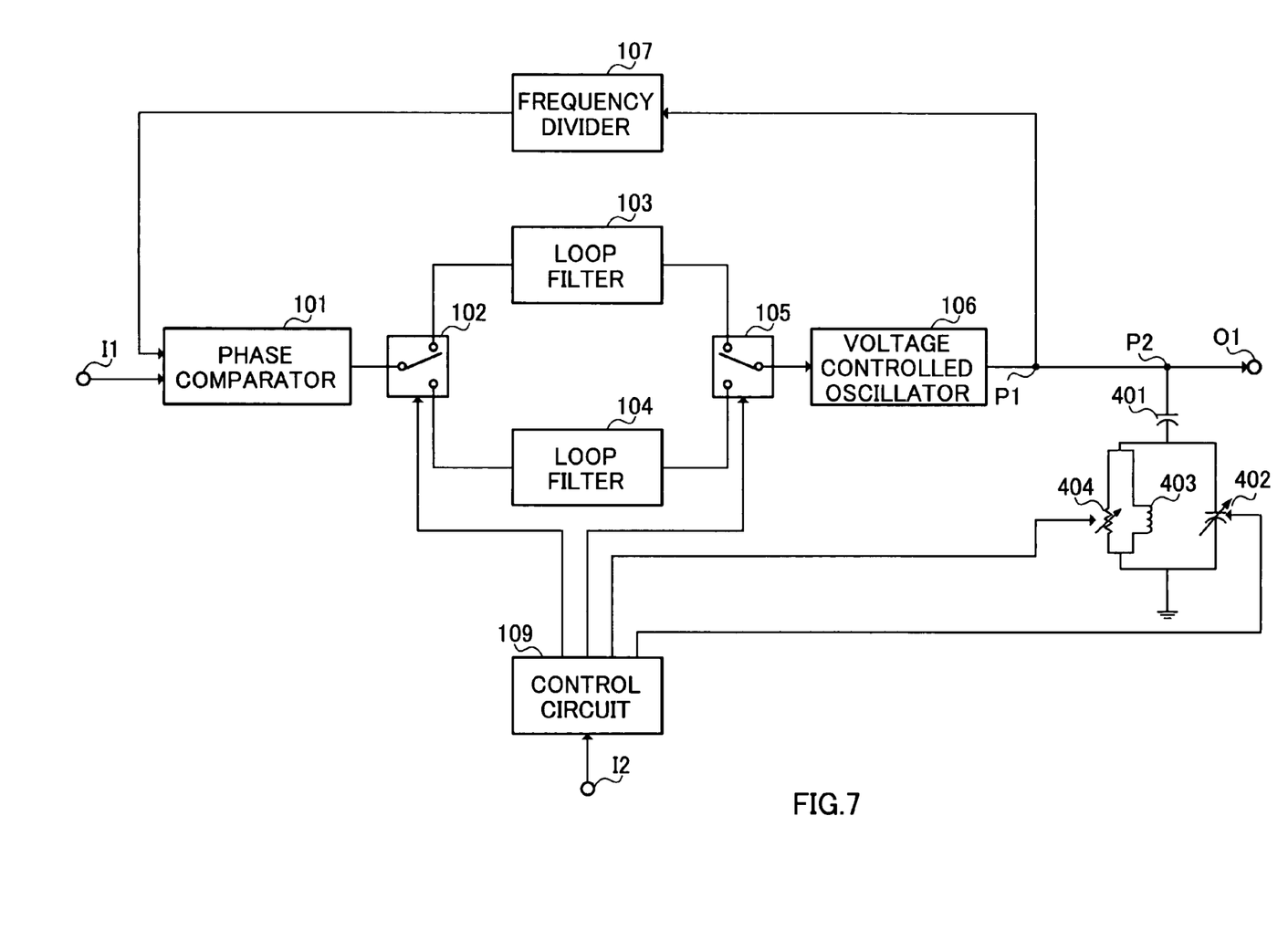
FIG. 7 is a block diagram showing the configuration of a PLL frequency synthesizer according to Embodiment 4 of the present invention.

FIG. 7 is a block diagram showing the configuration of a PLL frequency synthesizer according to Embodiment 4 of the present invention. Parts in FIG. 7 common to FIG. 4 are assigned the same codes as in FIG. 4, and detailed descriptions thereof are omitted. FIG. 7 differs from FIG. 4 in that a capacitor 401, inductor 403, and variable resistor 404 have been added, and variable capacitance capacitor 108 has been replaced by a variable capacitance capacitor 402.

One end of capacitor 401 is connected to junction point P1, and the other end is connected to parallel-connected variable capacitance capacitor 402, inductor 403, and variable resistor 404.

Variable capacitance capacitor 402 and inductor 403 are such that the residual FM component in high near C/N and high-speed lockup mode and the residual FM component in low residual FM mode are resonance frequencies, and a shorted state is established at the time of parallel resonance. By this means, the residual FM component can be reduced. That is to say, capacitor 401, variable capacitance capacitor 402, inductor 403, and variable resistor 404 function as a frequency fluctuation component elimination circuit.

Here, the residual FM component in each mode is found beforehand, and variable capacitance capacitor 402 and inductor 403 can be made to resonate in each mode by having control circuit 109 control variable capacitance capacitor 402 and variable resistor 404.

Thus, according to this embodiment, by connecting a variable capacitance capacitor, inductor, and variable resistor in parallel and connecting these in series with a capacitor, and changing the capacitance of the variable capacitance capacitor and the resistance value of the variable resistor in accordance with loop filter switching, when the cutoff frequency is high, residual FM can be reduced without degrading near C/N and lockup time characteristics, and when the cutoff frequency is low, residual FM can be further reduced, so that if the cutoff frequency is raised in proportion to this reduction, improvement of near C/N and shortening of lockup time can be achieved. By this means, improvement of near C/N, shortening of lockup time, and reduction of residual FM can be achieved.

Embodiment 5

Figure 8:
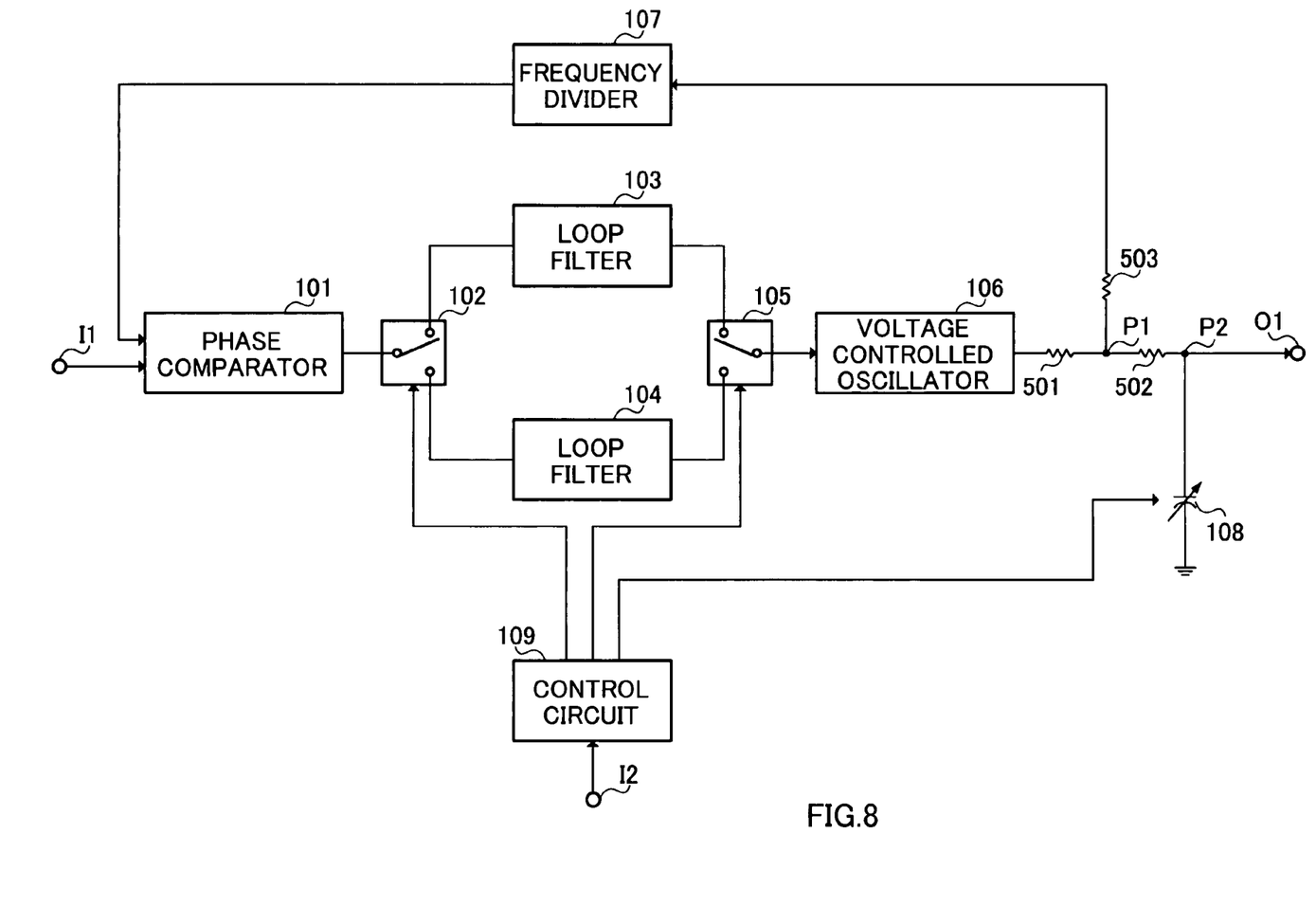
FIG. 8 is a block diagram showing the configuration of a PLL frequency synthesizer according to Embodiment 5 of the present invention.

FIG. 8 is a block diagram showing the configuration of a PLL frequency synthesizer according to Embodiment 5 of the present invention. Parts in FIG. 8 common to FIG. 4 are assigned the same codes as in FIG. 4, and detailed descriptions thereof are omitted. FIG. 8 differs from FIG. 4 in that resistors 501 through 503 have been added.

Resistor 501 is provided between the output side of voltage controlled oscillator 106 and junction point P1, resistor 502 is provided between junction points P1 and P2, and resistor 503 is provided between junction point P1 and frequency divider 107—that is, in the feedback signal line.

Here, the capacitance of variable capacitance capacitor 108 is varied in high near C/N mode and high-speed lockup mode and in low residual FM mode, and therefore the output impedance varies, but the amount of impedance variation is lessened due to the fact that resistors 501 through 503 are connected, enabling variation of voltage controlled oscillator 106 output impedance to be made small.

Thus, according to this embodiment, by connecting the output side of a voltage controlled oscillator to a frequency divider via resistors, and also connecting the output side of the voltage controlled oscillator to a variable capacitance capacitor via resistors, the amount of variation of the output impedance of the voltage controlled oscillator can be made small. Therefore, consistency can be achieved with circuitry connected to the subsequent stage of a PLL frequency synthesizer, and system stability can be achieved.

PLL frequency synthesizers of the above-described embodiments can be applied to various kinds of radio communication apparatuses, such as mobile phones, PHS devices, and wireless LANs.

Cases have been described in the above embodiments where two loop filters are used, but the present invention is not limited to this, and one loop filter or more than two loop filters may also be used.

A first aspect of the present invention is a PLL frequency synthesizer that has: a plurality of loop filters with different cutoff frequencies; an oscillation section that generates a frequency signal corresponding to a voltage output from the loop filters; a variable frequency fluctuation component elimination circuit that is provided between the oscillation section and an oscillation signal output terminal and that eliminates a frequency fluctuation component that varies for each of the plurality of loop filters; and a control section that performs control of the frequency fluctuation component elimination circuit in accordance with switching of the loop filters.

According to this configuration, by controlling a frequency fluctuation component elimination circuit in accordance with loop filter switching, when the loop filter is switched so as to give a cutoff frequency corresponding to the characteristics required by the system, if a loop filter with a high cutoff frequency is used, a frequency fluctuation component can be reduced without degrading near C/N and lockup time characteristics. Also, if a loop filter with a low cutoff frequency is used, a frequency fluctuation component can be further reduced, so that if the cutoff frequency is raised in proportion to this reduction, improvement of near C/N and shortening of lockup time can be achieved.

A second aspect of the present invention is a PLL frequency synthesizer in which, in the above-described aspect, the aforementioned frequency fluctuation component elimination circuit comprises a variable capacitance capacitor whereby self-resonance is performed with different frequency fluctuation components.

According to this configuration, when the frequency fluctuation component elimination circuit is made a variable capacitance capacitor, and the variable capacitance capacitor is grounded, the variable capacitance capacitor enters a shorted state at the time of self-resonance, and a frequency fluctuation component can be eliminated.

A third aspect of the present invention is a PLL frequency synthesizer in which, in the above-described aspect, the aforementioned frequency fluctuation component elimination circuit comprises a resonance circuit that resonates with different frequency fluctuation components.

According to this configuration, when the frequency fluctuation component elimination circuit is made a resonance circuit that resonates with different frequency fluctuation components, and the resonance circuit is grounded, the resonance circuit enters a shorted state at the time of resonance, and a frequency fluctuation component can be eliminated.

A fourth aspect of the present invention is a PLL frequency synthesizer in which, in the above-described aspect, resistors are provided between a junction point at which a signal line whereby output from the aforementioned oscillation section is fed back branches from the output line of the aforementioned oscillation section and the aforementioned oscillation section, in the aforementioned feedback signal line and the output line subsequent to the aforementioned junction point respectively.

According to this configuration, by providing resistors between a junction point at which a signal line whereby output from the oscillation section is fed back branches from the output line of the oscillation section and the oscillation section, in the feedback signal line and the output line subsequent to the junction point respectively, even if the output impedance of the oscillation section varies the amount of impedance variation can be lessened, enabling variation of the output impedance of the oscillation section to be made small.

A fifth aspect of the present invention is a radio communication apparatus equipped with a PLL frequency synthesizer of an above aspect.

According to this configuration, by controlling a frequency fluctuation component elimination circuit through linkage to loop filter switching, when the loop filter is switched so as to give a cutoff frequency corresponding to the characteristics required by the system, if a loop filter with a high cutoff frequency is used a frequency fluctuation component can be reduced without degrading near C/N and lockup time characteristics. Also, if a loop filter with a low cutoff frequency is used a frequency fluctuation component can be further reduced, so that if the cutoff frequency is raised in proportion to this reduction, improvement of near C/N and shortening of lockup time can be achieved.

The present application is based on Japanese Patent Application No. 2003-336800, filed on Sep. 29, 2003, the entire content of which is expressly incorporated herein by reference.

INDUSTRIAL APPLICABILITY

A PLL frequency synthesizer according to the present invention provides an advantage of achieving improvement of near C/N, shortening of lockup time, and reduction of residual FM, and can be applied to various kinds of radio communication apparatuses, such as mobile phones, PHS devices, and wireless LANs.

The invention claimed is:

1. A PLL frequency synthesizer comprising:
   a plurality of loop filters with different cutoff frequencies;
   an oscillation section that generates a frequency signal corresponding to a voltage output from one of said plurality of loop filters;
   a variable frequency fluctuation component elimination circuit that is provided between said oscillation section and an oscillation signal output terminal and that eliminates a frequency fluctuation component that varies for each of said plurality of loop filters; and
   a control section that performs control of said frequency fluctuation component elimination circuit in accordance with switching of said loop filters.

2. The PLL frequency synthesizer according to claim 1, wherein said frequency fluctuation component elimination circuit comprises a variable capacitance capacitor whereby self-resonance is performed with different frequency fluctuation components.

3. The PLL frequency synthesizer according to claim 1, wherein said frequency fluctuation component elimination circuit comprises a resonance circuit that resonates with different frequency fluctuation components.

4. The PLL frequency synthesizer according to claim 1, further comprising resistors provided between a junction point at which a signal line whereby output from said oscillation section is fed back branches from an output line of said oscillation section and said oscillation section, in said feedback signal line and an output line subsequent to said junction point respectively.

5. A radio communication apparatus comprising the PLL frequency synthesizer according to claim 1.

* * * * *